United States Patent
Kawamura

(10) Patent No.: US 8,198,902 B2
(45) Date of Patent: Jun. 12, 2012

(54) INSULATION STATE DETECTOR

(75) Inventor: Yoshihiro Kawamura, Makinohara (JP)

(73) Assignee: Yazaki Corporation, Tokyo (JP)

( * ) Notice: Subject to any disclaimer, the term of this patent is extended or adjusted under 35 U.S.C. 154(b) by 176 days.

(21) Appl. No.: 12/825,519

(22) Filed: Jun. 29, 2010

(65) Prior Publication Data

US 2011/0006781 A1  Jan. 13, 2011

(30) Foreign Application Priority Data

Jul. 8, 2009  (JP) .................................. 2009-161707

(51) Int. Cl.
  *G01R 31/02*  (2006.01)
(52) U.S. Cl. .......................... 324/551; 324/557; 324/509
(58) Field of Classification Search .................. 324/503, 324/504, 509, 557, 551; 361/42, 43
  See application file for complete search history.

(56) References Cited

U.S. PATENT DOCUMENTS 4,178,617 A * 12/1979 Reichel ........................... 361/43
5,818,236 A   10/1998 Sone et al.

FOREIGN PATENT DOCUMENTS

JP    8-226950 A    9/1996
JP    2007-170983 A 7/2007

* cited by examiner

*Primary Examiner* — Vincent Q Nguyen
(74) *Attorney, Agent, or Firm* — Sughrue Mion, PLLC

(57) ABSTRACT

An insulation state detector includes a capacitor, a measurement section measuring a charging voltage of the capacitor, a measuring circuit that connects the capacitor, which is insulated from a DC power source after being charged by the DC power source, between the measurement section and a ground potential portion, a detector detecting an insulation state of a voltage boosting circuit, and a reversed-polarity measuring circuit that connects the capacitor to the measurement section and the ground potential portion with reversed polarity when a potential corresponding to a division ratio of a positive-side ground fault resistor and a negative-side ground fault resistor on a secondary side of the voltage boosting circuit exceeds a positive potential of the DC power source and the capacitor is charged with reversed polarity by a secondary-side positive potential at the time of charging of the capacitor using the positive potential of the DC power source.

3 Claims, 6 Drawing Sheets

INSULATION STATE DETECTOR

BACKGROUND

The present invention relates to an insulation state detector which detects a ground fault or insulation state with respect to a ground potential portion on the basis of the charging voltage of a flying capacitor charged by a DC power source insulated from the ground potential portion.

For example, in a vehicle which uses electric power as energy for propulsion, it is common to insulate a high-voltage (for example, 200 V) DC power source from the vehicle body. In addition, as an insulation state detector which detects a ground fault or insulation state with respect to a ground potential portion of such a DC power source, a device that uses a flying capacitor charged by the DC power source is known in the related art. This kind of insulation state detector detects a ground fault resistor or insulation state on the positive or negative side by charging the flying capacitor with the positive or negative electric potential of the DC power source and measuring the charging voltage using a measurement section, such as a microcomputer.

In known insulation state detectors, a charging circuit, in which current flows through a negative-side ground fault resistor between a positive-side ground fault resistor and a negative-side ground fault resistor which are connected in series to each other, is formed when a flying capacitor is charged by the positive electric potential of a DC power source. On the other hand, when the flying capacitor is charged by the negative electric potential of the DC power source, a charging circuit in which a current flows through the positive-side ground fault resistor is formed. In addition, in both the charging circuits, the charging current flows through a connection point between the positive-side ground fault resistor and the negative-side ground fault resistor. The electric potential at this connection point (electric potential corresponding to the voltage division ratio of the positive-side ground fault resistor and the negative-side ground fault resistor) is equal to or smaller than the positive electric potential of the DC power source or equal to or larger than the negative electric potential of the DC power source.

Accordingly, when measuring the charging voltage in known insulation state detectors, the positive electrode of a flying capacitor connected to a measurement section is connected to the positive electric potential at the time of charging using the positive electric potential of the DC power source and is connected to the connection point between the positive-side ground fault resistor and the negative-side ground fault resistor at the time of charging using the negative electric potential of the DC power source. Such a connection change according to the state of the flying capacitor is performed by changing the on/off patterns of a plurality of switches provided in the device (for example, Patent Documents 1 and 2).
[Patent Document 1] JP-A-8-226950
[Patent Document 2] JP-A-2007-170983

In the vehicle which uses electric power as energy for propulsion as described above, in order to improve the driving efficiency of a load, the positive electric potential of a DC power source may be boosted and supplied to the load. In such a case, it is necessary to detect a ground fault or insulation state with respect to a ground potential portion for each of the primary side beforehand voltage boosting and the secondary side after voltage boosting. In order to use the above-described insulation state detector for the detection, the charging current of a charging circuit of a flying capacitor using the positive electric potential of a DC power source needs to flow not only through a negative-side ground fault resistor on the primary side but also through a negative-side ground fault resistor between a positive-side ground fault resistor and a negative-side ground fault resistor on the secondary side, which are connected in series to each other. In addition, a charging current of a charging circuit of the flying capacitor using the negative electric potential of the DC power source needs to flow through the positive-side ground fault resistor on the primary side but also through the positive-side ground fault resistor on the secondary side.

Here, the electric potential corresponding to the voltage division ratio of both ground fault resistors, which appears at the connection point between the positive-side ground fault resistor and the negative-side ground fault resistor on the secondary side, may exceed the positive electric potential on the primary side (of the DC power source) depending on the positive electric potential on the secondary side and the positive-side ground fault resistor on the secondary side. If the electric potential at the connection point between the positive-side ground fault resistor and the negative-side ground fault resistor on the secondary side exceeds the primary-side positive electric potential, in the switching state of charging a flying capacitor with the primary-side positive electric potential of the DC power source, the flying capacitor is actually charged with reversed polarity by the electric potential at the connection point between the positive-side ground fault resistor and the negative-side ground fault resistor on the secondary side which is higher than the primary-side positive electric potential.

In a known insulation state detecting circuit, however, the polarity of a flying capacitor connected to a measurement section when measuring the charging voltage is set beforehand by on/off patterns of switches. Therefore, if a flying capacitor is charged with reversed polarity as described above, the charging voltage cannot be measured by the measurement section even if a change to the state of measuring the charging voltage of the flying capacitor by the measurement section is made.

The above-described problem may be solved by connecting an insulation state detector to the secondary side. That is, if an insulation state detector is connected to the secondary side, charging of a flying capacitor using the positive electric potential is performed by the secondary-side positive electric potential which is always higher than the electric potential at the connection point between the positive-side ground fault resistor and the negative-side ground fault resistor on the secondary side. For this reason, the charging of the flying capacitor using the positive electric potential is performed with the same polarity all the time. Accordingly, the charging voltage can be certainly measured by the measurement section by deciding the on/off patterns of switches at the time of charging of the flying capacitor using the positive electric potential such that the flying capacitor is charged with the same polarity as when the flying capacitor is charged by the negative electric potential.

However, in order to connect the insulation state detector to the secondary side, it is necessary to raise the withstanding voltage of each element, which forms the insulation state detector, according to the electric potential on the secondary side. This increases the cost or the size. Moreover, in the detection of a ground fault or insulation state using an insulation state detector connected to the secondary side, it is easy for the electric potential to become unstable due to influence from an operation of a load or the like. Accordingly, it is true to try to avoid the situation if possible.

SUMMARY

The invention has been made in view of the above situation, and it is an object of the invention to provide an insulation state detector capable of measuring the charging voltage of a flying capacitor by a measurement section even if the flying capacitor is charged with reversed polarity by the positive electric potential on the secondary side, at the time of charging using the positive electric potential of a DC power source, due to the relationship between a ground fault resistor and the secondary-side positive electric potential obtained by boosting the positive electric potential of the DC power source insulated from a ground potential portion.

In order to achieve the above object, according to the present invention, there is provided an insulation state detector that is connected to a primary side of a voltage boosting power source circuit, which boosts a positive electric potential of a DC power source insulated from a ground potential portion and supplies the boosted positive electric potential to a load, comprising:

a flying capacitor that is charged with a voltage corresponding to a ground fault resistor by the DC power source;

a measurement section that measures a charging voltage of the flying capacitor;

a measuring circuit that connects the flying capacitor, which is insulated from the DC power source after being charged by the DC power source, in series between the measurement section and the ground potential portion;

a detecting section that detects an insulation state of the voltage boosting power source circuit based on a measurement result of the charging voltage of the flying capacitor obtained by the measurement section; and a reversed-polarity measuring circuit that connects the flying capacitor to the measurement section and the ground potential portion with reversed polarity when an electric potential corresponding to a division ratio of a positive-side ground fault resistor and a negative-side ground fault resistor on a secondary side of the voltage boosting power source circuit exceeds a positive electric potential of the DC power source and the flying capacitor is charged with reversed polarity by a secondary-side positive electric potential at the time of charging of the flying capacitor using the positive electric potential of the DC power source.

By the above configuration, when the flying capacitor is charged with reversed polarity by the positive electric potential on the secondary side at the time of charging using the positive electric potential of the DC power source, the positive electrode (electrode which becomes a negative electrode when charged by the positive electric potential of the DC power source) of the flying capacitor charged with reversed polarity is connected to the measurement section by the reversed-polarity measuring circuit in a state of being insulated from the DC power source. In addition, the negative electrode (electrode which becomes a positive electrode when charged by the positive electric potential of the DC power source) is connected to the ground potential portion by the reversed-polarity measuring circuit in a state of being insulated from the DC power source. Accordingly, the charging voltage of the flying capacitor charged with the reversed polarity can be measured by the measurement section.

As a result, even if the charging of the flying capacitor using the positive electric potential is performed by the positive electric potential on the primary side or performed by the positive electric potential on the secondary side depending on the relationship between the positive electric potential on the secondary side and the positive-side ground fault resistor on the secondary side and the polarity of the charged flying capacitor is reversed accordingly, the charging voltage of the flying capacitor can be measured by the measurement section.

According to the present invention, there is also provided an insulation state detector that is connected to a primary side of a voltage boosting power source circuit, which boosts a positive electric potential of a DC power source insulated from a ground potential portion and supplies the boosted positive electric potential to a load, comprising:

a flying capacitor that is charged with a voltage corresponding to a ground fault resistor by the DC power source;

a measurement section that measures a charging voltage of the flying capacitor;

a measuring circuit that connects the flying capacitor, which is insulated from the DC power source after being charged by the DC power source, in series between the measurement section and the ground potential portion;

a discharging circuit that connects a positive electrode of the flying capacitor, which is insulated from the DC power source and the measurement section after the measurement section has measured the charging voltage, to the ground potential portion through a discharge resistor;

a detecting section that detects an insulation state of the voltage boosting power source circuit based on a measurement result of the charging voltage of the flying capacitor obtained by the measurement section;

a bypass circuit that is branch-connected to a measuring circuit portion, which connects the flying capacitor with the ground potential portion, of the measuring circuit and that connects the flying capacitor with the measurement section, wherein when an electric potential corresponding to a division ratio of a positive-side ground fault resistor and a negative-side ground fault resistor on a secondary side of the voltage boosting power source circuit exceeds a positive electric potential of the DC power source and the flying capacitor is charged with reversed polarity by a secondary-side positive electric potential at the time of charging of the flying capacitor using the positive electric potential of the DC power source, the positive electrode of the flying capacitor, which is insulated from the DC power source after being charged by the positive electric potential of the DC power source, is connected to the measurement section by the bypass circuit while a negative electrode of the flying capacitor, which is insulated from the DC power source after being charged by the positive electric potential of the DC power source, is connected to the ground potential portion by the discharging circuit, and a positive electrode of the flying capacitor, which is insulated from the DC power source and the measurement section after the charging voltage of the flying capacitor charged by the positive electric potential of the DC power source is measured by the measurement section, is connected to the ground potential portion through a discharge resistor by the measuring circuit portion of the measuring circuit.

By the above configuration, when the flying capacitor is charged with reversed polarity by the positive electric potential on the secondary side at the time of charging using the positive electric potential of the DC power source, the positive electrode (electrode which becomes a negative electrode when charged by the positive electric potential of the DC power source) of the flying capacitor charged with reversed polarity is connected to the measurement section by the bypass circuit in a state of being insulated from the DC power source. In addition, the negative electrode (electrode which becomes a positive electrode when charged by the positive electric potential of the DC power source) is connected to the ground potential portion by the discharging circuit in a state of being insulated from the DC power source. Accordingly, the charging voltage of the flying capacitor charged with the reversed polarity can be measured by the measurement section.

In addition, after the charging voltage of the flying capacitor charged with the reversed polarity is measured by the measurement section, the positive electrode of the flying capacitor is connected to the ground potential portion by the measuring circuit portion, which connects the flying capacitor with the ground potential portion, of the measuring circuit. Accordingly, the charging voltage of the flying capacitor charged with the reversed polarity can be discharged toward the ground potential portion.

As a result, even if the charging of the flying capacitor using the positive electric potential is performed by the positive electric potential on the primary side or performed by the positive electric potential on the secondary side depending on the relationship between the positive electric potential on the secondary side and the positive-side ground fault resistor on the secondary side and the polarity of the charged flying capacitor is reversed accordingly, it is possible to measure the charging voltage of the flying capacitor by the measurement section and to discharge the charging voltage reliably after the measurement.

Moreover, in order to selectively connect the positive electrode and the negative electrode to the measurement section or the ground potential portion correctly when the flying capacitor is charged with reversed polarity, it is originally necessary to use another measuring circuit or discharging circuit additionally. In addition, the measurement section generally operates with a low electric potential compared with the electric potential of the DC power source insulated from the ground potential portion. Accordingly, it is necessary to use an insulated switch for the measuring circuit or the discharging circuit which performs switching of an object to which the flying capacitor is to be connected. For this reason, if another measuring circuit or discharging circuit is added, the insulated switch should be used twice.

However, by the above configuration, when the flying capacitor is charged with reversed polarity, the positive electrode and the negative electrode can be connected to the correct connection object only by adding the bypass circuit whose positive electrode is connected to the measurement section at the time of measurement of the charging voltage. Accordingly, the number of insulated switches increased can be suppressed compared with the case where another measuring circuit or discharging circuit is added. As a result, a steep increase in device costs due to an increase in the number of expensive components can be prevented.

In addition, since a ground fault or insulation state of the voltage boosting power source circuit can be detected by the insulation state detector connected to the primary side of the voltage boosting power source circuit, most ground faults and insulation states can be detected on the basis of the primary-side electric potential which is more stable than the secondary-side electric potential because there is little influence from an operation of a load and the like.

Preferably, a series circuit of the bypass circuit and the discharging circuit is an equivalent circuit of the measuring circuit, and the discharging circuit is an equivalent circuit of the measuring circuit portion of the measuring circuit.

By the above insulation state detector, each time constant of a charging/discharging circuit when the flying capacitor is charged by the positive electric potential of the DC power source is equal to each time constant of the charging/discharging circuit when the flying capacitor is charged with reversed polarity by the positive electric potential on the secondary side.

Accordingly, even if the flying capacitor is charged either by the positive electric potential of the DC power source or by the positive electric potential (reversed polarity) on the secondary side, the insulation state of the voltage boosting power source circuit can be detected by applying the same logic expression to the result obtained by measuring the charging voltage of the flying capacitor with the measurement section.

According to the insulation state detector of the invention, even if charging of the flying capacitor using the positive electric potential is performed by the positive electric potential on the primary side or performed by the positive electric potential on the secondary side depending on the relationship between the positive electric potential on the secondary side and the positive-side ground fault resistor on the secondary side and the polarity of the charged flying capacitor is reversed accordingly, the charging voltage of the flying capacitor can be measured by the measurement section.

BRIEF DESCRIPTION OF THE DRAWINGS

The above objects and advantages of the present invention will become more apparent by describing in detail preferred exemplary embodiments thereof with reference to the accompanying drawings, wherein.

DETAILED DESCRIPTION OF EXEMPLARY EMBODIMENTS

Hereinafter, an embodiment of an insulation state detector of the invention will be described with reference to the accompanying drawings.

Figure 1:
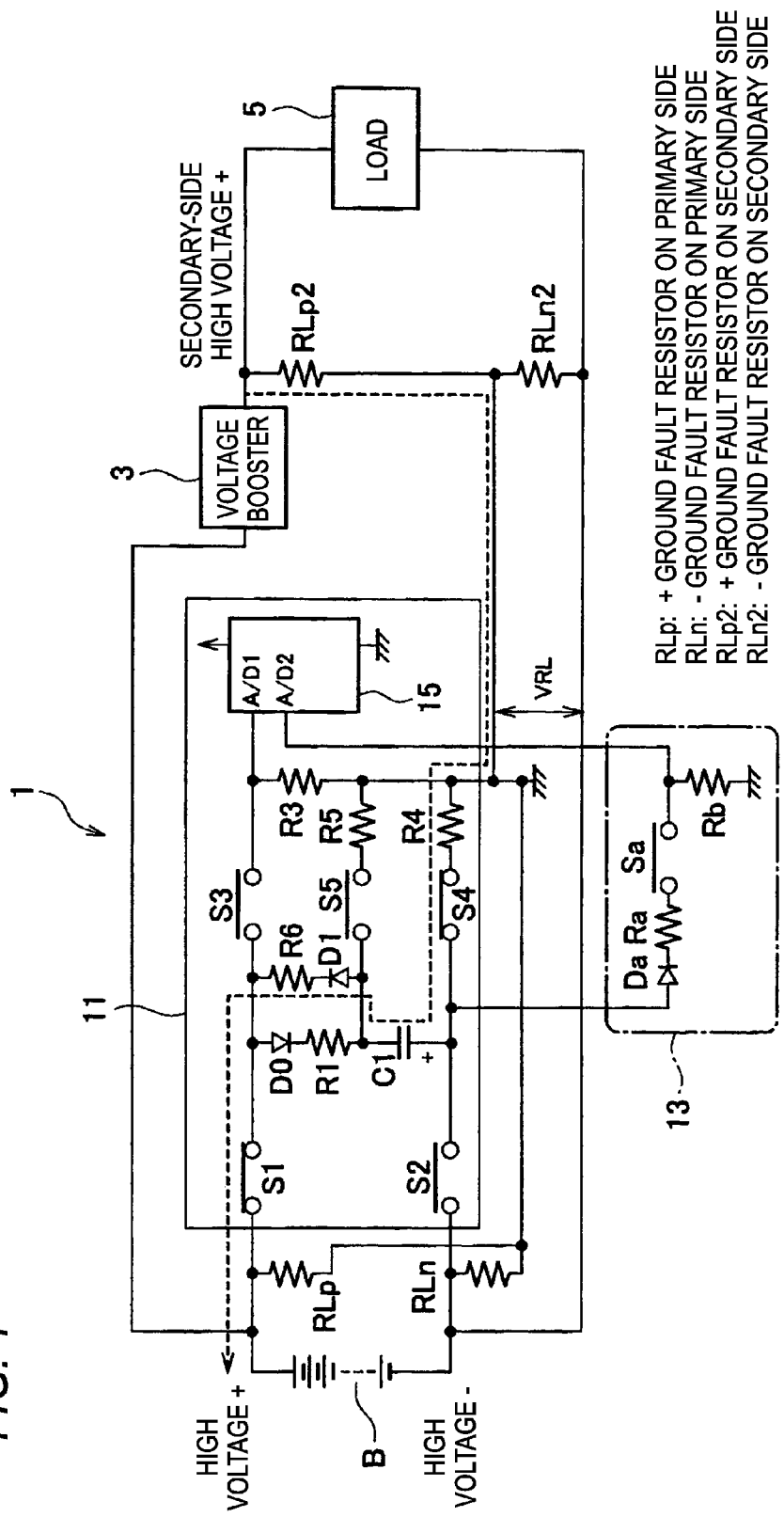
FIG. 1 is a circuit diagram showing a voltage boosting power source circuit which uses a ground fault sensor according to an embodiment of the invention for detection of the insulation state.

FIG. 1 is a circuit diagram showing a voltage boosting power source circuit which uses a ground fault sensor according to an embodiment of the invention for detection of the insulation state. In FIG. 1, a voltage boosting power source circuit denoted by reference numeral 1 is for boosting the positive electric potential of a high-voltage DC power source B on the primary side, which is insulated from a ground potential portion, by a voltage booster 3 and supplying it to a load 5 on the secondary side. Moreover, in FIG. 1, reference numeral RLp denotes a positive-side ground fault resistor on the primary side, and reference numeral RLn denotes a negative-side ground fault resistor on the primary side. Reference numeral RLp2 denotes a positive-side ground fault resistor on the secondary side, and reference numeral RLn2 denotes a negative-side ground fault resistor on the secondary side. A ground fault or insulation state of the voltage boosting power source circuit 1 is detected by a ground fault sensor 11 connected between positive and negative electrodes of the high-voltage DC power source B.

The ground fault sensor 11 (equivalent to an insulation state detector) has: a flying capacitor C1 with two polarities; switches S1 and S2 which selectively connect two electrodes of the flying capacitor C1 to the positive and negative electrodes of the high-voltage DC power source B, respectively; and switches S3 and S4 which selectively connect the two electrodes of the flying capacitor C1 to a microcomputer 15 (equivalent to a measurement section) and a ground potential portion, respectively.

In addition, the ground fault sensor 11 has: a switch S5 which selectively connects (selectively grounds) one electrode (in FIG. 1, an upper electrode) of the flying capacitor C1 to the ground potential portion for discharge; and a switch Sa which selectively connects the other end (in FIG. 1, a lower electrode) of the flying capacitor C1, to which the switch S4 is connected, to the micro computer 15.

Since the micro computer 15 operates by a low-voltage power source (not shown) which is lower than the high-voltage DC power source B, the high-voltage DC power source B is also insulated from the ground potential of the micro computer 15. Each of the switches S1 to S5 and Sa is formed of an optical MOSFET, for example, and is insulated from the high-voltage DC power source B so that it can be on/off controlled by the micro computer 15.

A connection point between the micro computer 15 and the switch S3 is grounded through a resistor R3, and a connection point between the micro computer 15 and the switch Sa is grounded through a resistor Rb. A resistor R4 is connected between the switch S4 and the ground potential portion, and a resistor R5 is connected between the switch S5 and the ground potential portion. The switches S1 and S3 located at the one end side of the flying capacitor C1 are connected in series to each other, a current direction switching circuit is connected between a connection point of the switches S1 and S3 and the one end of the flying capacitor C1.

The current direction switching circuit is a parallel circuit. One side of the current direction switching circuit is formed by a series circuit of a diode D0, which has a forward direction from the switches S1 and S3 toward the one end of the flying capacitor C1, and a resistor R1. The other side of the current direction switching circuit is formed by a series circuit of a diode D1, which has a forward direction from the one end of the flying capacitor C1 toward the switches S1 and S3, and a resistor R6.

A Diode Da, which has a forward direction from the other end of the flying capacitor C1 toward the switch Sa, and a resistor Ra are connected in series between the switch Sa and the other end of the flying capacitor C1.

In the ground fault sensor 11 of the present embodiment described above, a series circuit (equivalent to a measuring circuit portion, which connects a flying capacitor with a ground potential portion, of the measuring circuit) of the switch S4 and the resistor R4 and a series circuit of the diode Da, the resistor Ra, the switch Sa, and the resistor Rb are provided in parallel between the other end of the flying capacitor C1 and the ground potential portion. Moreover, in the ground fault sensor 11 of the present embodiment, a negative potential measuring circuit 13 is formed by the series circuit of the diode Da, the resistor Ra, the switch Sa, and the resistor Rb.

In addition, in the ground fault sensor 11 of the present embodiment, a port of the micro computer 15 to which both electrodes of the flying capacitor C1 are selectively connected by the switches S3 and S4 and a port of the micro computer 15 to which the other end of the flying capacitor C1 is selectively connected by the switch Sa are provided as individual ports. That is, both the electrodes of the flying capacitor C1 are selectively connected to a first A/D conversion port A/D1 of the micro computer 15 by the switches S3 and S4, respectively. On the other hand, the other end of the flying capacitor C1 is selectively connected to a second A/D conversion port A/D2 of the micro computer 15 by the switch Sa.

Figure 2:
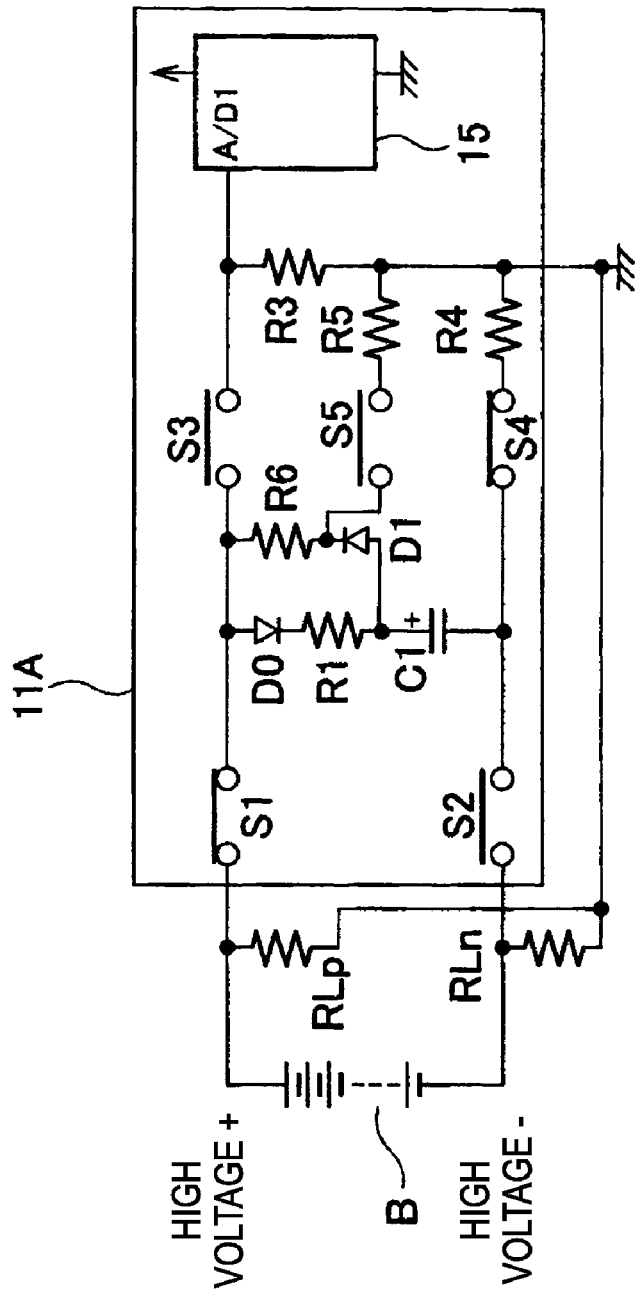
FIG. 2 is a circuit diagram illustrating a case where a ground fault sensor as a base of an insulation state detector shown in FIG. 1 is used for insulation state detection of a high-voltage DC power source B.

The ground fault sensor 11 of the present embodiment described above is based on a ground fault sensor 11A which is shown in FIG. 2 and which is used to detect the insulation state of the high-voltage DC power source B. The ground fault sensor 11A does not have a negative potential measuring circuit 13 unlike the ground fault sensor 11 of the present embodiment shown in FIG. 1. In addition, in the ground fault sensor 11A shown in FIG. 2, the switch S5 is not directly connected to one end of the flying capacitor C1 but is connected to the one end of the flying capacitor C1 through the diode D1 (not to the anode side of the diode D1 but to the cathode side of the diode D1).

In the ground fault sensor 11A shown in FIG. 2, first of all, the switches S1 and S2 are turned on while the switches S3 to S5 are turned off by control of the micro computer 15 when detecting a ground fault or insulation state. As a result, a charging circuit ranging from the positive electrode of the high-voltage DC power source B to the negative electrode of the high-voltage DC power source B through the switch S1, the diode D0, the resistor R1, one and the other ends of the flying capacitor C1, and the switch S2 is formed. In addition, in the charging circuit, the flying capacitor C1 is charged with the charge amount corresponding to the voltage of the high-voltage DC power source B. By this charging, one end of the flying capacitor C1 becomes a positive electrode and the other end of the flying capacitor C1 becomes a negative electrode.

Then, the switches S3 and S4 are turned on while the switches 51, S2, and S5 are turned off by control of the micro computer 15. As a result, the flying capacitor C1 is connected in parallel to a series circuit of the resistor R6, the resistor R3, and the resistor R4. Then, an electric potential, which is equivalent to the difference between voltages of both ends of the resistor R3, when the charging voltage of the flying capacitor C1 is divided by the resistors R6, R3, and R4 is input to the first A/D conversion port A/D1 of the micro computer 15 and is measured. From the measured value and the voltage division ratio of the resistors R6, R3, and R4, the charging voltage of the flying capacitor C1 is measured by the micro computer 15. Accordingly, in the present embodiment, a measuring circuit is formed by the diode D1, the resistor R6, the switch S3, the resistor R3, the switch S4, and the resistor R4.

In addition, by control of the micro computer 15, the switch S5 is turned on and the other switches S1 to S4 are turned off. Accordingly, since one end (positive electrode) of the flying capacitor C1 is grounded through the diode D1, the switch S5, and the resistor R5, a discharging circuit is formed. Then, the flying capacitor C1 is discharged by the discharging circuit.

Then, the switches S1 and S4 are turned on while the switches S2, S3, and S5 are turned off by control of the micro computer 15. As a result, a charging circuit ranging from the positive electrode of the high-voltage DC power source B to the negative electrode of the high-voltage DC power source B through the switch S1, the diode D0, the resistor R1, one and the other ends of the flying capacitor C1, the switch S4, the resistor R4, the (ground potential portion), and the negative-side ground fault resistor RLn is formed. In addition, in the charging circuit, the flying capacitor C1 is charged with the charge amount corresponding to the negative-side ground fault resistor RLn. By this charging, one end of the flying capacitor C1 becomes a positive electrode and the other end of the flying capacitor C1 becomes a negative electrode.

Then, the switches S1, S2, and S5 are turned off while the switches S3 and S4 are turned on by control of the micro computer 15, such that the same measuring circuit as when measuring the charging voltage of the flying capacitor C1 corresponding to the voltage of the high-voltage DC power source B is formed. Then, using this measuring circuit, the charging voltage of the flying capacitor C1 is measured by the micro computer 15.

In addition, by control of the micro computer 15, the switch S5 is turned on and the other switches S1 to S4 are turned off. Accordingly, since one end (positive electrode) of the flying capacitor C1 is grounded through the diode D1, the switch S5, and the resistor R5, a discharging circuit is formed. Then, the flying capacitor C1 is discharged by the discharging circuit.

Then, the switches S2 and S3 are turned on while the switches S1, S4, and S5 are turned off by control of the micro computer 15. As a result, a charging circuit ranging from the positive electrode of the high-voltage DC power source B to the negative electrode of the high-voltage DC power source B through the positive-side ground fault resistor RLp, the (ground potential portion), the resistor R3, the switch S3, the diode D0, the resistor R1, one and the other ends of the flying capacitor C1, and the switch S2 is formed. In addition, in the charging circuit, the flying capacitor C1 is charged with the charge amount corresponding to the positive-side ground fault resistor RLp. By this charging, one end of the flying capacitor C1 becomes a positive electrode and the other end of the flying capacitor C1 becomes a negative electrode.

Then, the switches S1, S2, and S5 are turned off while the switches S3 and S4 are turned on by control of the micro computer 15, such that the same measuring circuit as when measuring the charging voltage of the flying capacitor C1 corresponding to the voltage of the high-voltage DC power source B or when measuring the charging voltage of the flying capacitor C1 corresponding to the negative-side ground fault resistor RLn is formed. Then, using this measuring circuit, the charging voltage of the flying capacitor C1 is measured by the micro computer 15.

In addition, by control of the micro computer 15, the switch S5 is turned on and the other switches S1 to S4 are turned off. Accordingly, since one end (positive electrode) of the flying capacitor C1 is grounded through the diode D1, the switch S5, and the resistor R5, a discharging circuit is formed. Then, the flying capacitor C1 is discharged by the discharging circuit.

By performing the calculation of predetermined logic expression for measurement using the charging voltage of the flying capacitor C1 corresponding to the voltage of the high-voltage DC power source B, the charging voltage of the flying capacitor C1 corresponding to the negative-side ground fault resistor RLn, and the charging voltage of the flying capacitor C1 corresponding to the positive-side ground fault resistor RLp which have been measured as described above, the micro computer 15 can detect the ground fault or the insulation state of the high-voltage DC power source B based on the value of the positive-side ground fault resistor RLp or the value of the negative-side ground fault resistor RLn.

Figure 3:
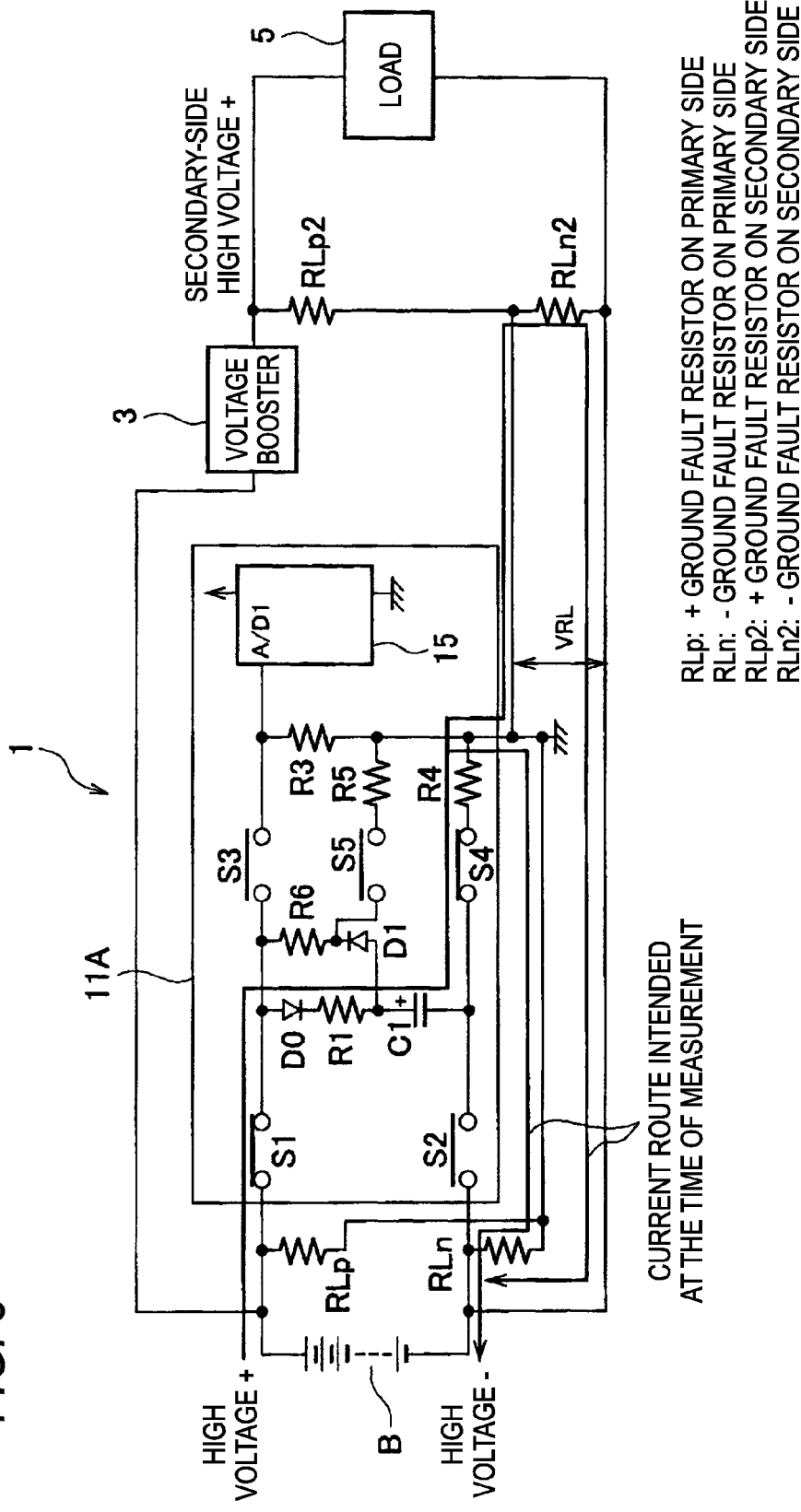
FIG. 3 is a circuit diagram illustrating a case where the ground fault sensor shown in FIG. 2 is used for insulation state detection in the voltage boosting power source circuit shown in FIG. 1.

A circuit diagram when the ground fault sensor 11A described above is used to detect the ground fault or the insulation state of the voltage boosting power source circuit 1 shown in FIG. 1 is shown in FIG. 3. In this case, charging of the flying capacitor C1 based on the charge amount corresponding to the voltage of the high-voltage DC power source B and detection of the charging voltage may be executed, using the ground fault sensor 11A, by switching of on/off patterns of the switches S1 to S4 when performing the charging of the flying capacitor C1 corresponding to the voltage of the high-voltage DC power source B and the detection of the charging voltage which have been described with reference to FIG. 2.

In addition, charging of the flying capacitor C1 based on the charge amount corresponding to the positive-side ground fault resistor RLp in the voltage boosting power source circuit 1 and detection of the charging voltage may also be executed, using the ground fault sensor 11A, by switching of on/off patterns of the switches S1 to S4 when performing the charging of the flying capacitor C1 corresponding to the positive-side ground fault resistor RLp and the detection of the charging voltage which have been described with reference to FIG. 2.

That is, first of all, the switches S2 and S3 are turned on while the switches S1, S4, and S5 are turned off by control of the micro computer 15. As a result, as described above, the charging circuit when charging the flying capacitor C1 with the charge amount corresponding to the positive-side ground fault resistor RLp is formed as a primary-side charging circuit. Moreover, at the secondary side, a charging circuit ranging up to the negative electrode of the high-voltage DC power source B through the positive-side ground fault resistor RLp2 on the secondary side, the (ground potential portion), the resistor R3, the switch S3, the diode D0, the resistor R1, one and the other ends of the flying capacitor C1, and the switch S2 is formed. In these charging circuits, the flying capacitor C1 is charged with the charge amount corresponding to the positive-side ground fault resistors RLp and RLp2 on the primary and secondary sides. By this charging, one end of the flying capacitor C1 becomes a positive electrode and the other end of the flying capacitor C1 becomes a negative electrode.

Then, the switches S1, S2, and S5 are turned off while the switches S3 and S4 are turned on by control of the micro computer 15, such that the same measuring circuit as when measuring the charging voltage of the flying capacitor C1 corresponding to the high-voltage DC power source B is formed. Then, using this measuring circuit, the charging voltage of the flying capacitor C1 is measured by the micro computer 15.

However, charging of the flying capacitor C1 based on the charge amount corresponding to the negative-side ground fault resistor RLn in the voltage boosting power source circuit 1 and detection of the charging voltage may be executed, using the ground fault sensor 11A, by switching of on/off patterns of the switches S1 to S4 when performing the charging of the flying capacitor C1 corresponding to the negative-side ground fault resistor RLn and the detection of the charging voltage which have been described with reference to FIG. 2, or may not be executed.

That is, first of all, when turning on the switches S1 and S4 while turning off the switches S2, S3, and S5 by control of the micro computer 15, a charging circuit when charging the flying capacitor C1 with the charge amount corresponding to the negative-side ground fault resistor RLn is formed as a primary-side charging circuit, and a charging circuit ranging from the ground potential portion to the negative electrode of the high-voltage DC power source B through the negative-side ground fault resistor RLn2 is formed at the secondary side branching off from the other end of the flying capacitor C1, ideally as shown in FIG. 3. In the case where the charging circuits are ideally formed as described above, the flying capacitor C1 in these charging circuits is charged with the charge amount corresponding to the negative-side ground fault resistors RLn and RLn2 on the primary and secondary sides. By this charging, one end of the flying capacitor C1 becomes a positive electrode and the other end of the flying capacitor C1 becomes a negative electrode.

Then, the switches S1, S2, and S5 are turned off while the switches S3 and S4 are turned on by control of the micro computer 15, such that the same measuring circuit as when measuring the charging voltage of the flying capacitor C1 corresponding to the high-voltage DC power source B or when measuring the charging voltage of the flying capacitor C1 corresponding to the positive-side ground fault resistor RLp is formed. Then, using this measuring circuit, the charging voltage of the flying capacitor C1 is measured by the micro computer 15.

However, the ideal formation of the charging circuit described above is limited to the case where the electric potential VRL corresponding to the voltage division ratio of the positive-side ground fault resistor RLp2 and the negative-side ground fault resistor RLn2 on the secondary side, which are connected in series to each other in the circuit, is smaller than the positive electric potential of the high-voltage DC power source B on the primary side.

On the contrary, if the electric potential VRL corresponding to the voltage division ratio of the positive-side ground fault resistor RLp2 and the negative-side ground fault resistor RLn2 on the secondary side is larger than the positive electric potential of the high-voltage DC power source B on the primary side, a charging circuit, which is formed when the switches S1 and S4 are turned on while the switches S2, S3, and S5 are turned off by control of the micro computer 15, is as follows.

Figure 4:
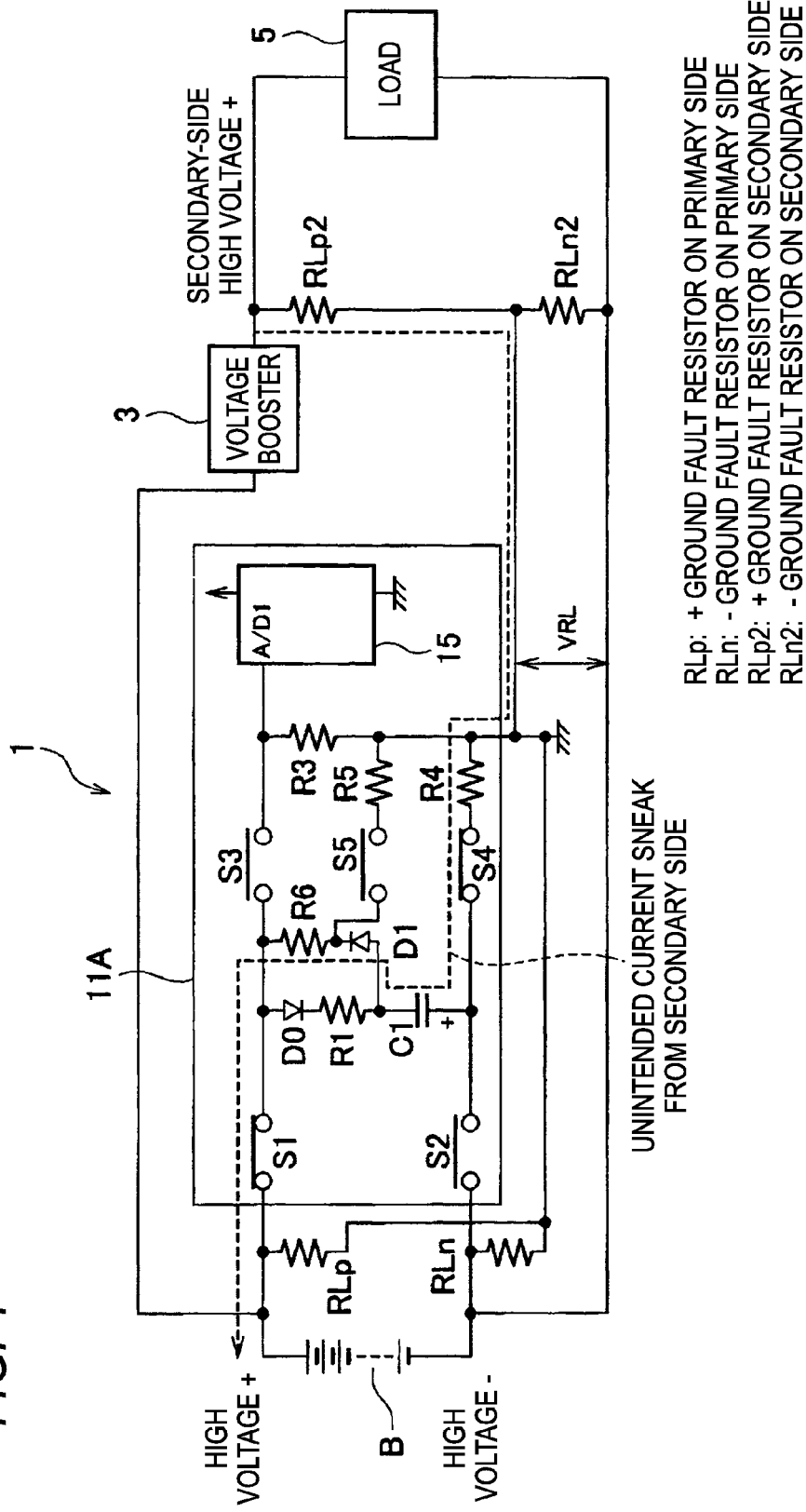
FIG. 4 is a circuit diagram illustrating a case where a flying capacitor is charged with reversed polarity by the positive electric potential on the secondary side in the insulation state detection of a voltage boosting power source circuit using a ground fault sensor shown in FIG. 3.

That is, the charging circuit formed in this case is a circuit ranging from the secondary side of the voltage booster 3 to the positive electrode of the high-voltage DC power source B through the positive-side ground fault resistor RLp2 on the secondary side, the connection point (electric potential VRL) between the positive-side ground fault resistor RLp2 and the negative-side ground fault resistor RLn2 on the secondary side, the resistor R4, the switch S4, the other end and one end of the flying capacitor C1, the diode D1, the resistor R6, and the switch S1, as shown in a circuit diagram in FIG. 4. In this case, in this charging circuit, the flying capacitor C1 is charged with the charge amount corresponding to the positive-side ground fault resistors RLp2 on the secondary side. By this charging, the other end of the flying capacitor C1 becomes a positive electrode and one end of the flying capacitor C1 becomes a negative electrode. As a result, the charging polarities of the flying capacitor C1 become opposite to those in the case of charging using the ideal charging circuit shown in FIG. 3.

Then, the switches S1, S2, and S5 are turned off while the switches S3 and S4 are turned on by control of the micro computer 15, such that the same measuring circuit as when measuring the charging voltage of the flying capacitor C1 corresponding to the high-voltage DC power source B or when measuring the charging voltage of the flying capacitor C1 corresponding to the positive-side ground fault resistor RLp is formed. In this case, one end of the flying capacitor C1 which is a negative electrode is connected to the micro computer 15. For this reason, the charging voltage of the flying capacitor C1 cannot be measured by the micro computer 15.

Therefore, in the ground fault sensor 11 of the present embodiment shown in FIG. 1, the negative potential measuring circuit 13 which is not present in the ground fault sensor 11A shown in FIG. 2 is provided. Moreover, in the case where the electric potential VRL corresponding to the voltage division ratio of the positive-side ground fault resistor RLp2 and the negative-side ground fault resistor RLn2 on the secondary side is larger than the positive electric potential of the high-voltage DC power source B on the primary side, the ground fault sensor 11 of the present embodiment performs the following when detecting a ground fault or insulation state in the voltage boosting power source circuit 1.

That is, first of all, the switches S1 and S4 are turned on while the switches S2, S3, S5, and Sa are turned off by control of the micro computer 15, as shown in FIG. 1. As a result, a charging circuit with the same path as that shown in the circuit diagram in FIG. 4 is formed. Then, in this charging circuit, the flying capacitor C1 is charged with the charge amount corresponding to the positive-side ground fault resistors RLp2 on the secondary side. In this case, the other end of the flying capacitor C1 becomes a positive electrode, and one end of the flying capacitor C1 becomes a negative electrode. As a result, the charging polarities of the flying capacitor C1 become opposite polarities.

Figure 5:
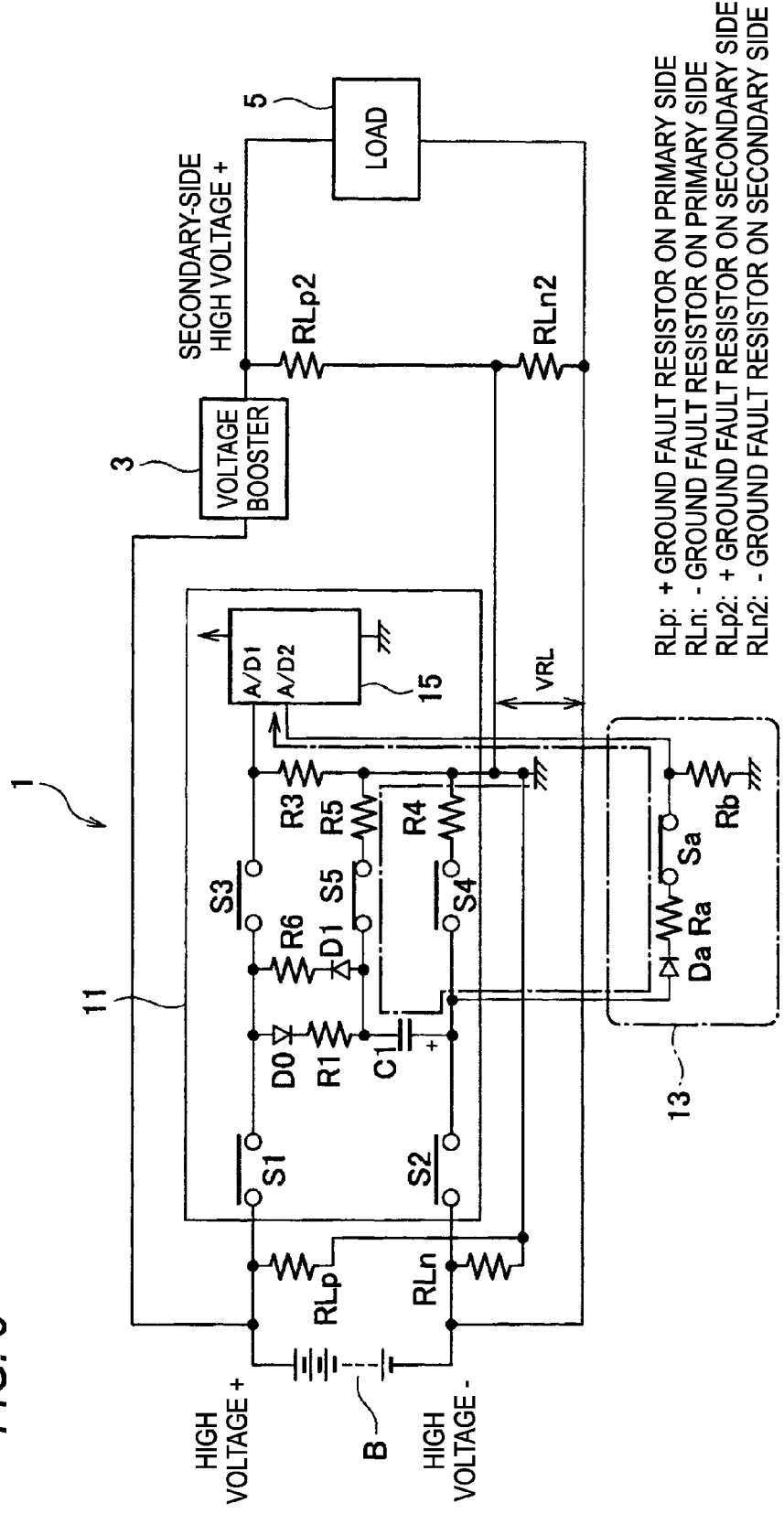
FIG. 5 is a circuit diagram illustrating a case of measuring the charging voltage of a flying capacitor of a ground fault sensor charged with reversed polarity by the positive electric potential on the secondary side in the voltage boosting power source circuit shown in FIG. 1.

Then, as shown in a circuit diagram in FIG. 5, the switches S5 and Sa are turned on while the switches S1 to S4 are turned off by control of the micro computer 15. As a result, the other end (positive electrode) of the flying capacitor C1 is connected to the second A/D conversion port A/D2 of the micro computer 15 through the diode Da, the resistor Ra, and the switch Sa of the negative potential measuring circuit 13 and one end (negative electrode) of the flying capacitor C1 is grounded through the switch S5 and the resistor R5, thereby forming a measuring circuit. Then, using this measuring circuit, the charging voltage of the flying capacitor C1 is measured by the micro computer 15.

In addition, by control of the micro computer 15, the switch S4 is turned on and the other switches S1 to S3, S5, and Sa are turned off. Accordingly, since the other end (positive electrode) of the flying capacitor C1 is grounded through the switch S4 and resistor R4, a discharging circuit is formed. Then, the flying capacitor C1 is discharged by the discharging circuit.

Moreover, in the case where the electric potential VRL corresponding to the voltage division ratio of the positive-side ground fault resistor RLp2 and the negative-side ground fault resistor RLn2 on the secondary side, which are connected in series to each other in the circuit, is smaller than the positive electric potential of the high-voltage DC power source B on the primary side, the ground fault sensor 11 of the present embodiment performs the following when detecting a ground fault or insulation state in the voltage boosting power source circuit 1.

That is, first of all, the switches S1 and S4 are turned on while the switches S2, S3, S5, and Sa are turned off by control of the micro computer 15, as shown in FIG. 1. As a result, a charging circuit with the same path as that shown in the circuit diagram in FIG. 3 is formed. In this charging circuit, the flying capacitor C1 is charged with the charge amount corresponding to the negative-side ground fault resistors RLn and RLn2 on the primary and secondary sides. In this case, one end of the flying capacitor C1 becomes a positive electrode and the other end of the flying capacitor C1 becomes a negative electrode.

Then, the switches S3 and S4 are turned on while the switches S1, S2, S5, and Sa are turned off by control of the micro computer 15. As a result, one end (positive electrode) of the flying capacitor C1 is connected to the first A/D conversion port A/D1 of the micro computer 15 through the diode D1, the resistor R6, and the switch S3 and the other end (negative electrode) of the flying capacitor C1 is grounded through the switch S4 and the resistor R4, thereby forming a measuring circuit (equivalent to a measuring circuit). Then, using this measuring circuit, the charging voltage of the flying capacitor C1 is measured by the micro computer 15.

In addition, by control of the micro computer 15, the switch S5 is turned on and the other switches S1 to S4 and Sa are turned off. Accordingly, since one end (positive electrode) of the flying capacitor C1 is grounded through the switch S5 and the resistor R5, a discharging circuit is formed. Then, the flying capacitor C1 is discharged by the discharging circuit.

In addition, in the ground fault sensor 11 of the present embodiment, the diode Da, the resistor Ra, and the switch Sa of the negative potential measuring circuit 13, which connects the other end (positive electrode) of the flying capacitor C1 to the second ND conversion port A/D2 of the micro computer 15, are equivalent to a bypass circuit. In addition, in the ground fault sensor 11 of the present embodiment, the discharging circuit formed by the switch S5 and the resistor R5 is equivalent to a discharging circuit. In addition, in the ground fault sensor 11 of the present embodiment, a reversed-polarity measuring circuit is formed by the negative potential measuring circuit 13 and the discharging circuit using the switch S5 and the resistor R5.

Moreover, in the ground fault sensor 11 of the present embodiment, a series circuit of the diode Da, the resistor Ra, and the switch Sa of the negative potential measuring circuit 13, which form the bypass circuit and are connected to the other end as a positive electrode of the flying capacitor C1 charged with reversed polarity, and the switch S5 and the resistor R5, which form the discharging circuit and are connected to one end as a negative electrode of the flying capacitor C1 charged with reversed polarity, is an equivalent circuit of a measuring circuit using a series circuit of the diode D1, the resistor R6, and the switch S3, which connect one end (positive electrode) of the flying capacitor C1 charged with straight polarity to the first ND conversion port A/D1 of the micro computer 15, and the switch S4 and the resistor R4 which ground the other end (negative electrode) of the flying capacitor C1 charged with straight polarity.

Moreover, in the ground fault sensor 11 of the present embodiment, a series circuit of the switch S5 and the resistor R5 which form the discharging circuit is an equivalent circuit of a series circuit portion of the switch S4 and the resistor R4, which ground the other end (negative electrode) of the flying capacitor C1 charged with straight polarity, of a circuit which forms a measuring circuit.

Therefore, the diodes Da and D1, the resistors Ra and R6, the resistors Rb and R3, and the resistors R5 and R4 which have the same rated values are used.

Accordingly, in the ground fault sensor 11 of the present embodiment, in both the case where the flying capacitor C1 is charged with straight polarity (one end is a positive electrode and the other end is a negative electrode) and the case where the flying capacitor C1 is charged with reversed polarity (one end is a negative electrode and the other end is a positive electrode), the voltage division ratio of the charging voltage at the time of measurement of the charging voltage is the same. Therefore, regardless of whether the flying capacitor is charged with straight polarity or the flying capacitor is charged with reversed polarity, a ground fault or insulation state of the voltage boosting power source circuit 1 can be detected on the basis of the values of the ground fault resistor RLp, RLn, RLp2, and RLn2 by calculation using a common logic expression.

In addition, if the resistors R1 and R6 of the current direction switching circuit are made to have the same rated value (resistance value), the charging time constant of the flying capacitor C1 at the time of measurement of the charging voltage becomes the same regardless of whether the flying capacitor C1 is charged with straight polarity or the flying capacitor C1 is charged with reversed polarity. This is also very effective when detecting the ground fault or the insulation state of the voltage boosting power source circuit 1 on the basis of the values of the ground fault resistors RLp, RLn, RLp2, and RLn2 using a common logic expression irrespective of the charging polarity of the flying capacitor C1.

Figure 6:
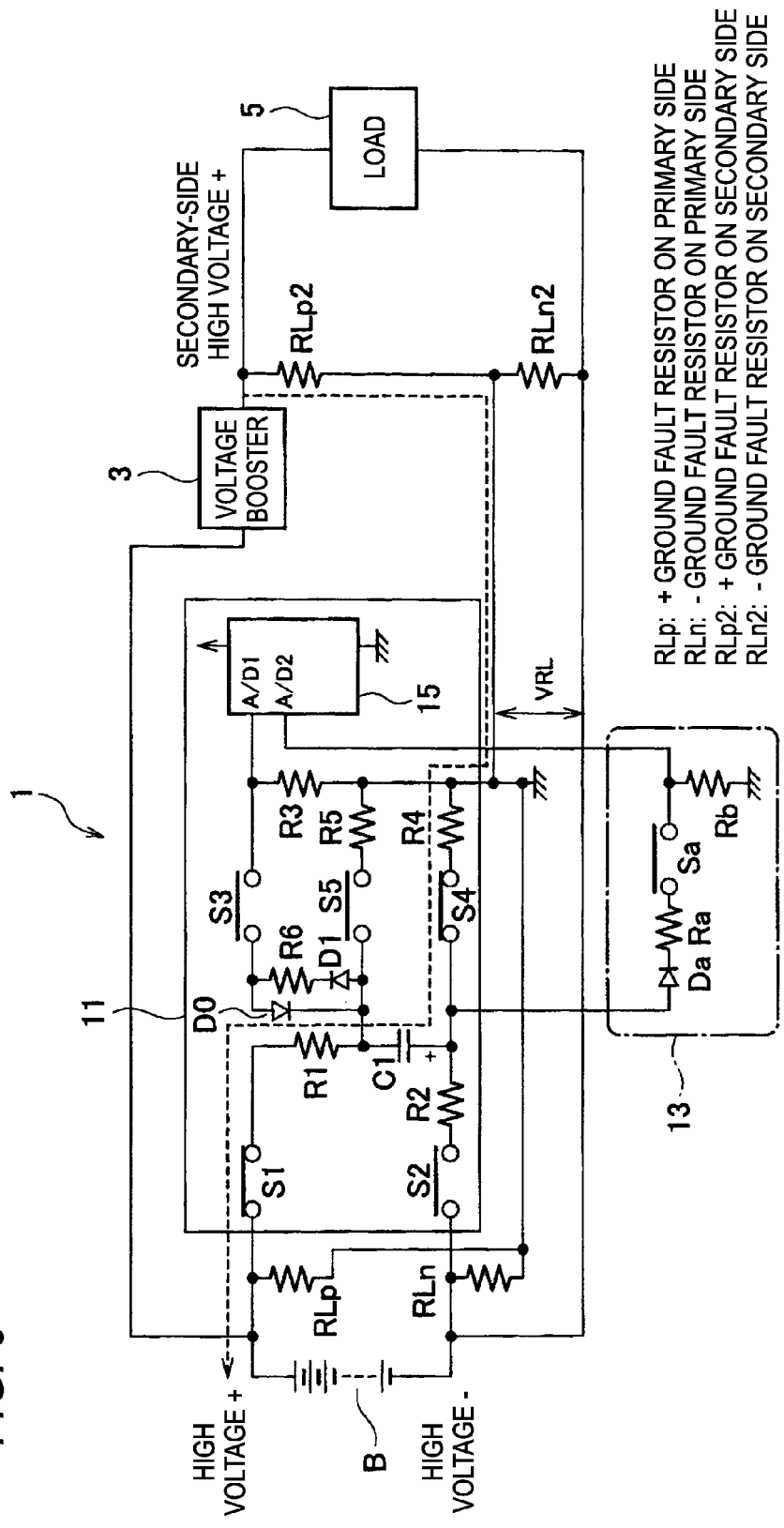
FIG. 6 is a circuit diagram showing a voltage boosting power source circuit which uses a ground fault sensor according to another embodiment of the invention for detection of the insulation state.

The ground fault sensor 11 of the present embodiment shown in the FIGS. 1 and 5, which has been described until now, has a circuit configuration based on the assumption that the capacitance of the flying capacitor C1 is not changed by the charging voltage. Accordingly, it is preferable to use a film capacitor as the flying capacitor C1. However, a ceramic capacitor whose capacitance changes with the charging voltage may also be used as the flying capacitor C1. FIG. 6 is a circuit diagram showing a voltage boosting power source circuit which uses a ground fault sensor according to another embodiment of the invention, which has such a circuit configuration, for detection of the insulation state.

A ground fault sensor 11 of the embodiment shown in FIG. 6 is different from the ground fault sensor 11 of the embodiment shown in FIGS. 1 and 5 in the configuration of a current direction switching circuit. Specifically, the resistor R1, which is connected in series to the diode D0 in the ground fault sensor 11 of the embodiment shown in FIGS. 1 and 5, is connected in series to the switch 1, and a cathode of the diode D0 is connected in series to one end of the flying capacitor C1. In addition, in the ground fault sensor 11 of the embodiment shown in FIG. 6, the resistor R2 is connected between the switch S2 and the other end of the flying capacitor C1 according to the change of the configuration of the current direction switching circuit.

In the ground fault sensor 11 shown in FIG. 6 which has a circuit configuration described above, in the case where the switches 51 and S4 are turned on while the switches S2, S3, S5, and Sa are turned off by control of the micro computer 15 when detecting a ground fault or insulation state on the negative side of the voltage boosting power source circuit 1, a charging circuit with the same path as that shown in the circuit diagram in FIG. 3 is formed if the electric potential VRL corresponding to the voltage division ratio of the positive-side ground fault resistor RLp2 and the negative-side ground fault resistor RLn2 on the secondary side is smaller than the positive electric potential of the high-voltage DC power source B on the primary side. On the other hand, if the electric potential VRL corresponding to the voltage division ratio of the positive-side ground fault resistor RLp2 and the negative-side ground fault resistor RLn2 on the secondary side is larger than the positive electric potential of the high-voltage DC power source B on the primary side, a charging circuit with the same path as that shown in the circuit diagram in FIG. 4 is formed.

According to which charging circuit is formed, it is determined whether the flying capacitor C1 is charged with straight polarity or with reversed polarity. In both the charging circuits, a charging current of the flying capacitor C1 passes through the resistor R1. Accordingly, the flying capacitor C1 is charged by the time constant decided by the resistor R1. As a result, even if the resistors R1 and R6 of the current direction switching circuit are not made to have the same rated value (resistance value) unlike the ground fault sensor 11 of the present embodiment shown in FIGS. 1 and 5, it is possible to detect a ground fault or insulation state of the voltage boosting power source circuit 1 on the basis of the values of the ground fault resistors RLp, RLn, RLp2, and RLn2 by using a common logic expression irrespective of the charging polarity of the flying capacitor C1.

Until now, the two kinds of ground fault sensor 11 according to the embodiment of the invention have been described. In any cases, however, the number of A/D conversion ports of the micro computer 15 may be set to 1, for example, by wired OR connection between an input of the first A/D conversion port A/D1 of the micro computer 15 and an input of the second A/D conversion port A/D2 of the micro computer 15. By such a configuration, it is possible to reduce the number of A/D conversion ports or interface components (for example, bypass capacitors or clamp diodes).

Moreover, in the two kinds of ground fault sensor 11 described above, the diodes Da and D1, the resistors Ra and R6, the resistors Rb and R3, and the resistors R5 and R4 which have the same rated values are used so that circuits using those elements become equivalent circuits. However, the above configuration does not have to be necessarily adopted.

For example, the resistors Rb and R3 which have the same rated value (resistance value) may be used. In this configuration, the voltage division ratio of the charging voltage at the time of measurement of the charging voltage is different between the charging voltage in the case of straight polarity of the flying capacitor C1, which is input to the first A/D conversion port A/D1 of the micro computer 15, and the charging voltage in the case of reversed polarity of the flying capacitor C1, which is input to the second A/D conversion port A/D2. Accordingly, by offsetting the charging voltage measured by the charging polarity of the flying capacitor C1, the logic of handling a charging voltage based on straight polarity and a charging voltage based on reversed polarity differently can be realized by control of the micro computer 15.

In addition, in the two kinds of ground fault sensor 11 described above, a part or the entirety of a measuring circuit at the time of charging voltage measurement using the micro computer 15 or a discharging circuit after measurement in the case where the flying capacitor C1 is charged with straight polarity is shared to form a measuring circuit at the time of charging voltage measurement using the micro computer 15 and a discharging circuit after measurement in the case where the flying capacitor C1 is charged with reversed polarity.

However, it is needless to say that the measuring circuit at the time of charging voltage measurement using the micro computer 15 and the discharging circuit after measurement in the case where the flying capacitor C1 is charged with reversed polarity may be formed separately from the measuring circuit at the time of charging voltage measurement using the micro computer 15 or the discharging circuit after measurement in the case where the flying capacitor C1 is charged with straight polarity.

The invention is suitable when detecting the insulation state of a voltage boosting power source circuit by measuring the charging voltage of a flying capacitor on the primary side of the voltage boosting power source circuit, which boosts the positive electric potential from a DC power source insulated from a ground potential portion and supplies it to a load, using a measurement section.

Although the invention has been illustrated and described for the particular preferred embodiments, it is apparent to a person skilled in the art that various changes and modifications can be made on the basis of the teachings of the invention. It is apparent that such changes and modifications are within the spirit, scope, and intention of the invention as defined by the appended claims.

The present application is based on Japanese Patent Application No. 2009-161707 on Jul. 8, 2009, the contents of which are incorporated herein by reference.

What is claimed is:

1. An insulation state detector that is connected to a primary side of a voltage boosting power source circuit, which boosts a positive electric potential of a DC power source insulated from a ground potential portion and supplies the boosted positive electric potential to a load, comprising:
a flying capacitor that is charged with a voltage corresponding to a ground fault resistor by the DC power source;
a measurement section that measures a charging voltage of the flying capacitor;
a measuring circuit that connects the flying capacitor, which is insulated from the DC power source after being charged by the DC power source, in series between the measurement section and the ground potential portion;
a detecting section that detects an insulation state of the voltage boosting power source circuit based on a measurement result of the charging voltage of the flying capacitor obtained by the measurement section; and
a reversed-polarity measuring circuit that connects the flying capacitor to the measurement section and the ground potential portion with reversed polarity when an electric potential corresponding to a division ratio of a positive-side ground fault resistor and a negative-side ground fault resistor on a secondary side of the voltage boosting power source circuit exceeds a positive electric potential of the DC power source and the flying capacitor is charged with reversed polarity by a secondary-side positive electric potential at the time of charging of the flying capacitor using the positive electric potential of the DC power source.

2. An insulation state detector that is connected to a primary side of a voltage boosting power source circuit, which boosts a positive electric potential of a DC power source insulated from a ground potential portion and supplies the boosted positive electric potential to a load, comprising:
a flying capacitor that is charged with a voltage corresponding to a ground fault resistor by the DC power source;
a measurement section that measures a charging voltage of the flying capacitor;
a measuring circuit that connects the flying capacitor, which is insulated from the DC power source after being charged by the DC power source, in series between the measurement section and the ground potential portion;
a discharging circuit that connects a positive electrode of the flying capacitor, which is insulated from the DC power source and the measurement section after the measurement section has measured the charging voltage, to the ground potential portion through a discharge resistor;
a detecting section that detects an insulation state of the voltage boosting power source circuit based on a measurement result of the charging voltage of the flying capacitor obtained by the measurement section;
a bypass circuit that is branch-connected to a measuring circuit portion, which connects the flying capacitor with the ground potential portion, of the measuring circuit and that connects the flying capacitor with the measurement section,
wherein when an electric potential corresponding to a division ratio of a positive-side ground fault resistor and a negative-side ground fault resistor on a secondary side of the voltage boosting power source circuit exceeds a positive electric potential of the DC power source and the flying capacitor is charged with reversed polarity by a secondary-side positive electric potential at the time of charging of the flying capacitor using the positive electric potential of the DC power source, the positive electrode of the flying capacitor, which is insulated from the DC power source after being charged by the positive electric potential of the DC power source, is connected to the measurement section by the bypass circuit while a negative electrode of the flying capacitor, which is insulated from the DC power source after being charged by the positive electric potential of the DC power source, is connected to the ground potential portion by the discharging circuit, and a positive electrode of the flying capacitor, which is insulated from the DC power source and the measurement section after the charging voltage of the flying capacitor charged by the positive electric potential of the DC power source is measured by the measurement section, is connected to the ground potential portion through a discharge resistor by the measuring circuit portion of the measuring circuit.

3. The insulation state detector according to claim 2, wherein a series circuit of the bypass circuit and the discharging circuit is an equivalent circuit of the measuring circuit; and wherein the discharging circuit is an equivalent circuit of the measuring circuit portion of the measuring circuit.

* * * * *